US006140242A

United States Patent [19]

Oh et al.

[11] Patent Number: 6,140,242

[45] Date of Patent: Oct. 31, 2000

[54] METHOD OF FORMING AN ISOLATION TRENCH IN A SEMICONDUCTOR DEVICE INCLUDING ANNEALING AT AN INCREASED TEMPERATURE

[75] Inventors: Yong-chul Oh; Young-Woo Park, both of Kyunggi-do, Rep. of Korea

[73] Assignee: Samsung Electronics Co., Ltd., Suwon, Rep. of Korea

[21] Appl. No.: 09/203,670

[22] Filed: Dec. 1, 1998

[30] Foreign Application Priority Data

Dec. 1, 1997 [KR] Rep. of Korea ...................... 97-65100

[51] Int. Cl.[7] .................................................. H01L 21/302

[52] U.S. Cl. .......................... 438/698; 438/692; 438/697; 438/719; 438/738; 438/756; 438/723; 438/724

[58] Field of Search .................................... 438/692, 697, 438/698, 719, 738, 756, 723, 724

[56] References Cited

U.S. PATENT DOCUMENTS 5,395,790 3/1995 Lur ........................................... 437/69
5,643,823 7/1997 Ho et al. .................................. 437/67
5,786,262 7/1998 Jang et al. ............................. 438/424
5,926,722 7/1999 Jang et al. ............................. 438/424

FOREIGN PATENT DOCUMENTS 776036 5/1997 Japan .

*Primary Examiner*—Shrive Beck
*Assistant Examiner*—George Goudreau
*Attorney, Agent, or Firm*—Jones Volentine, LLC

[57] ABSTRACT

A method of forming an isolation trench in a semiconductor device results in increasing trench isolation characteristics by optimizing an annealing temperature thereby removing substrate defects caused during the etching of a semiconductor substrate and relieving stress thereby improving yield and reliability of devices. Appropriate adjustment of the rates of temperature change allow higher annealing temperatures to be employed without encountering attendant stresses due to differences in thermal expansion coefficients between the substrate and the trench material.

11 Claims, 6 Drawing Sheets

METHOD OF FORMING AN ISOLATION TRENCH IN A SEMICONDUCTOR DEVICE INCLUDING ANNEALING AT AN INCREASED TEMPERATURE

CROSS-REFERENCE TO RELATED APPLICATIONS

The present application claims priority under 35 U.S.C. §119 to Korean Patent Application No. 97-65100 filed on Dec. 1, 1997, the entire contents of which are hereby incorporated by reference.

BACKGROUND OF THE INVENTION

1. Field of the Invention

The present invention relates to a method of fabricating a semiconductor device, more particularly, to a method of forming a trench isolation which improves characteristics of trench filling layer.

2. Description of Related Art

With the recent trend toward high density devices, the art of isolating devices built on a semiconductor substrate becomes one of most important aspects of the integrated circuit industry. Improper device isolation may cause current leakages, which can consume significant power for the entire chip. In addition, improper device isolation can further escalate latch-up, resulting in momentary or permanent damage to the circuit function. Still further, improper device isolation can result in noise margin degradation, voltage shift and/or crosstalk.

The conventional LOCOS(local oxidation of silicon) process is used to develop regions which laterally isolate the active device regions on the integrated circuits. As well known in the art, the structure mentioned above possesses some inherent drawbacks resulting from the processes, i.e., lateral oxidation of the silicon underneath the silicon nitride mask, making the edge of the field oxide resemble the shape of a bird's beak, and the lateral diffusion of channel-stop dopants, making the dopants encroach into the active device regions, making the physical channel width less than the desired channel width. The reduced portion overtaken by both effects will make the situation even worse when devices are scaled down for very large scale integration(VLSI) implementation, increasing threshold voltage and reducing the current driving capability.

According to the disadvantage mentioned above for the LOCOS isolation structure, an isolation technique using shallow trench has been developed. Generally, the shallow trench isolation(hereinafter referred to "STI") includes etching a silicon substrate to a predetermined depth thereby to form a trench, depositing CVD (chemical vapor deposition) oxide layer to fill up the trench, and planarizing the CVD oxide layer.

However, the STI technique also possesses some inherent drawbacks resulting from the processes, i.e., substrate defects during plasma etching the semiconductor substrate, result in dislocation, thereby increasing junction leakage, constant turn on phenomenon of the source and drain of the transistor.

FIG. 1 is a schematic view showing annealing recipe for densification of the trench fill layer according to a prior art method. Referring to FIG. 1, annealing for densification of the trench fill layer includes a stand-by state at a temperature between 400° C. and 650° C., a ramp up stage 2 for increasing the temperature from the stand-up state value to 1000° C. at a rate of 7.5° C./min, an annealing stage 4 for densification of the trench fill layer at 1000° C., a ramp down stage 6 for decreasing temperature from 1000° C. back down to the 400° C. to 650° C. of the stand-by state at a rate of 3.3° C./min, stand-by states 3 and 5 before and after the annealing stage 4, respectively, and an unloading stage 7 of substrate.

However, the substrate point defects resulting from etching the semiconductor substrate can grow along in a specific direction thereby forming a dislocation plane or a dislocation line while going through the annealing for densification of the trench fill layer. The dislocation plane or line usually occurs in the edge or sidewall of the trench and serves as a leakage source. This is due to the strong stress caused by the difference between the thermal expansion coefficient of the semiconductor substrate and that of the trench fill layer.

SUMMARY OF THE INVENTION

The present invention is intended to solve the problems, and it is an object of the invention to provide a method of forming a trench isolation which can prevent substrate defects resulting from etching a semiconductor substrate.

It is a further object of the invention to provide a method of forming a trench isolation which can minimize the stress resulting from a difference between the thermal coefficients of the trench fill layer and the semiconductor substrate.

Other aspect, objects, and the several advantages of the present invention will be apparent to one skilled in the art from a reading of the following disclosure and appended claims.

These and other advantages may be realized in accordance with the present invention by providing a method of forming an isolation trench in a semiconductor device including: forming a trench etch mask layer over a semiconductor substrate; patterning the trench etch mask layer and exposing the semiconductor substrate where an isolation trench is to be formed; etching an exposed portion of the semiconductor substrate, thereby forming the isolation trench; forming a thin oxide layer in the isolation trench; filling up the isolation trench with an insulating layer; and performing annealing at a temperature of at least 1150° C. so as to remove substrate defects caused during the etching of the semiconductor substrate.

The method may include, prior to the patterning, laminating the trench etch mask layer with a pad oxide layer, a pad nitride layer, a high temperature oxide layer, and an anti-reflective coating layer in this order. The etching may include forming an isolation trench having a depth between 0.1 μm and 1.5 μm. The forming may include forming a thin oxide layer having a thickness between about 100 Å and 500 Å. The filling may include using an undoped silicate glass layer as the insulating layer.

The annealing may include first increasing a temperature at a first increasing rate from a first temperature in a stand-by state to a second temperature; second increasing the temperature at a second increasing rate from the second temperature to a third temperature of at least 1150° C.; densifying the insulating layer at the third temperature; first decreasing the temperature at a first decreasing rate from the third temperature down to the second temperature; and second decreasing the temperature at a second decreasing rate from the second temperature down to the first temperature. Preferably, at least one of the second increasing rate is less than the first increasing rate and the first decreasing rate is less than the second decreasing rate. Even more preferably, the second increasing rate is less than the first increasing rate and the first decreasing rate is less than the second decreasing rate. Preferably, the first increasing rate is 7.5° C./min, the second temperature is 1000° C., the second increasing rate is 5.0° C./min, the first decreasing rate is 2.0° C./min, and the second decreasing rate is 3.3° C./min.

The above and other objects may further be realized in accordance with the present invention by providing a method of forming an isolation trench in a semiconductor device including: forming a trench etch mask layer over a semiconductor substrate; patterning the trench etch mask layer and exposing the semiconductor substrate where an isolation trench is to be formed; etching an exposed portion of the semiconductor substrate, thereby forming the isolation trench; forming a thin oxide layer in the isolation trench; filling up the isolation trench with an insulating layer; performing first annealing at a temperature below a first temperature so as to remove substrate defects caused during the etching of the semiconductor substrate and to densify the insulating layer; planarizing the insulating layer; and performing second annealing at a temperature above the first temperature so as to remove substrate defects caused during the etching of the semiconductor and to densify the insulating layer.

The first temperature may be 1000° C. The method may include, prior to the patterning, laminating the trench etch mask layer with a pad oxide layer, a pad nitride layer, a high temperature oxide layer, and an anti-reflective coating layer in this order. The etching may include forming an isolation trench having a depth between 0.1 μm and 1.5 μm. The forming may include forming a thin oxide layer having a thickness between about 100 Å and 500 Å. The filling may include using an undoped silicate glass layer as the insulating layer.

The second annealing includes: first increasing a temperature at a first increasing rate from a stand-by temperature in a stand-by state to the first temperature; second increasing the temperature at a second increasing rate from the first temperature to a second temperature; densifying the insulating layer at the second temperature; first decreasing the temperature at a first decreasing rate from the second temperature down to the first temperature; and second decreasing the temperature at a second decreasing rate from the first temperature down to the stand-by temperature. Preferably, at least one of the second increasing rate is less than the first increasing rate and the first decreasing rate is less than the second decreasing rate. More preferably, the second increasing rate is less than the first increasing rate and the first decreasing rate is less than the second decreasing rate. Preferably, the first increasing rate is 7.5° C./min, the first temperature is 1000° C., the second increasing rate is 5.0° C./min, and the second temperature is at least 1150° C. Preferably, the first temperature is 1000° C., the second temperature is at least 1150° C., the first decreasing rate is 2.0° C./min, and the second decreasing rate is 3.3° C./min.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

Figure 1:
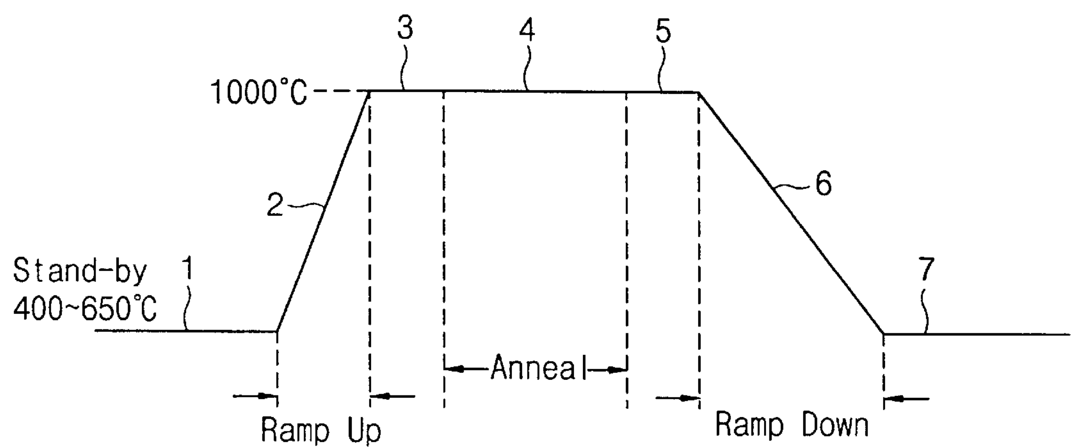
FIG. 1 is a schematic view showing an annealing process for densification of the trench fill layer according to a prior art method.

The present invention will be described in detail through preferred embodiments with reference to accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Also, when a layer is defined to exist on another layer or a substrate, the layer may exist directly on another layer or substrate, or an interlayer layer may be present therebetween. Throughout the drawings, the same reference numerals denote the same elements.

FIGS. 2*a* to FIG. 2*f* are cross-sectional views showing a novel method of forming an isolation trench according to an embodiment of the present invention.

Figure 2A:
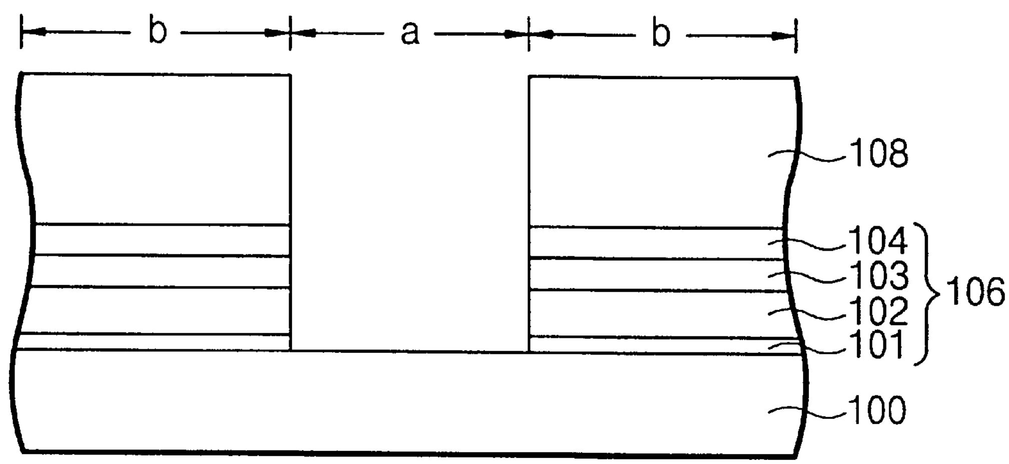
FIGS. 2*a* to FIG. 2*f* are cross-sectional views illustrating a novel method of forming an isolation trench according to an embodiment of the present invention.

Referring to FIG. 2*a*, a trench etch mask layer 106 is formed over a semiconductor substrate 100. The trench etch mask layer 106 is laminated with a pad oxide layer 101, a pad nitride layer 102, an HTO(high temperature oxide) layer 103, and an ARC(anti-reflection coating) layer, such as a silicon oxynitride layer(SiON), 104 in this order. More particularly, the pad oxide layer 101 is preferably formed through thermal oxidation method to have a thickness of about 70 Å to 160 Å. The pad nitride layer 102 is preferably formed by a conventional method such as LPCVD(low pressure chemical vapor deposition) to have a thickness of about 1500 Å and the HTO layer 103 is preferably formed to have a thickness of about 500 Å. The SiON layer 104 is preferably formed to have a thickness of about 600 Å.

Herein, the HTO layer 103 and ARC layer 104 serve as an etch mask during subsequent etching of the semiconductor substrate 100 and planarizing of subsequent trench fill layer. The ARC layer 104 is provided to acquire processing margins and uniformity of critical dimensions during subsequent photolithography.

After the trench etch mask layer 106 formation, a photoresist layer is deposited and patterned to predetermined configuration, i.e., a photoresist layer pattern 108 that defines a trench forming region (a) and a device isolation region (b). The trench etch mask layer 106 is etched thereby to expose the semiconductor substrate 100 corresponding to the trench forming region (a) by using the photoresist layer pattern 108 as a mask.

Figure 2B:
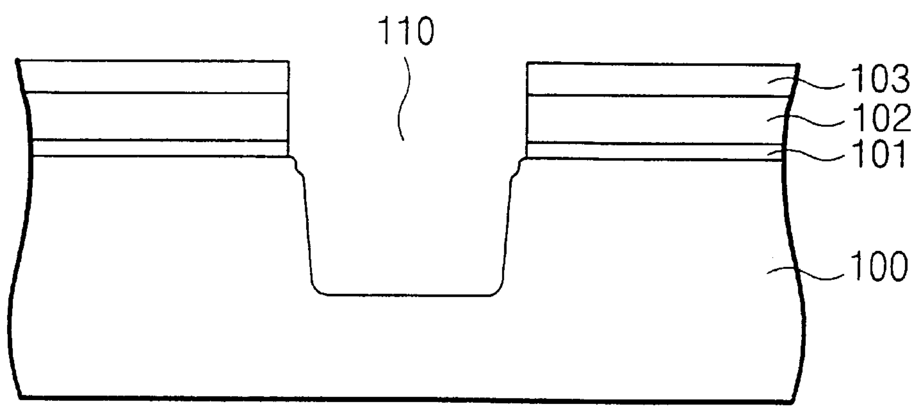

Referring to FIG. 2*b*, the exposed portion of the semiconductor substrate 100 is dry etched thereby to form a trench 110. The trench side walls may be substantially vertical to the substrate or may have a slight slope. Also, sidewalls of the upper portion of the trench 110 may have a stairway profile. In the specific embodiment shown, the etching is targeted to form a 0.25 μm trench having a depth of about 0.1 μ to 1.5 μ. During the removing of the photoresist layer pattern 108, portions of the trench etch mask layer 106, i.e., ARC layer, are etched away to expose the HTO layer 103.

Figure 2C:
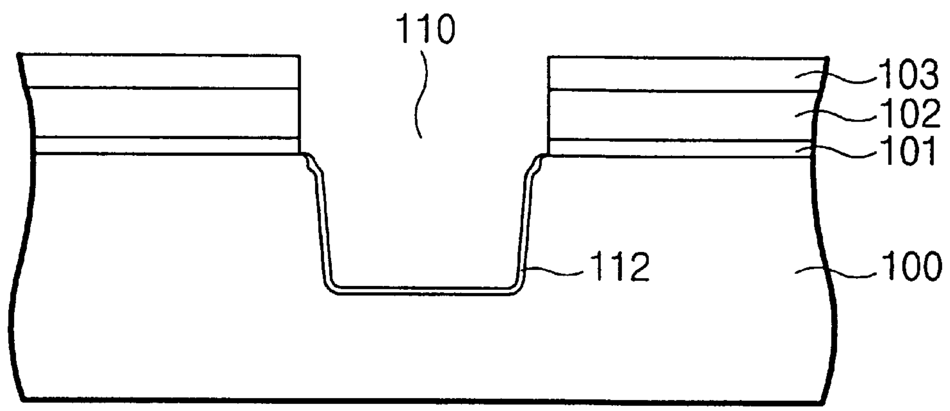

Referring to FIG. 2*c*, a thermal oxide layer 112 is grown in the trench 110, i.e., on the bottom and sidewalls of the trench 110, so as to remove the crystal defects such as a damaged lattice layer resulting from aforementioned etching the semiconductor substrate 100. The sidewall oxide layer 112 preferably has a thickness of about 100 Å to 500 Å.

Figure 2D:
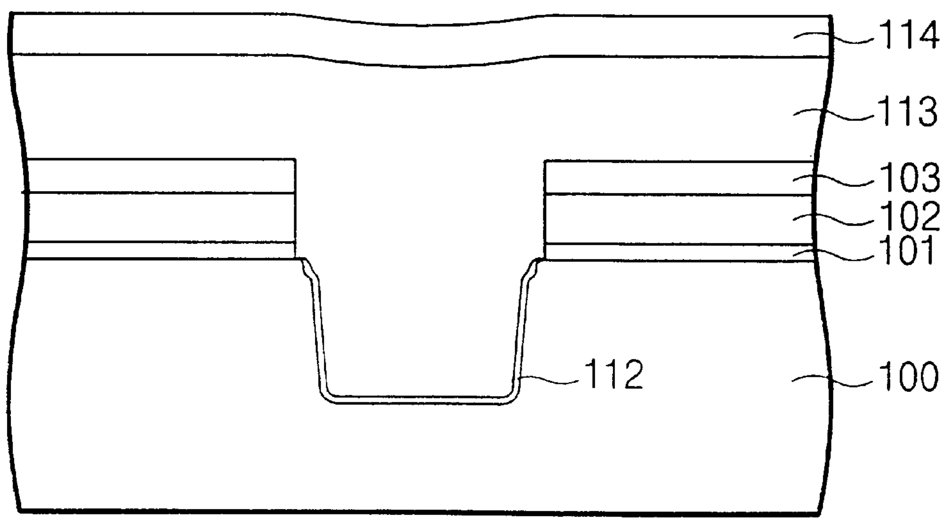

Referring to FIG. 2*d*, trench filling insulating layers 113 and 114 are deposited to fill up the trench 110. The trench fill layers 113 and 114 are preferably laminated with an USG (undoped silicate glass) layer 113 and a PE-TEOS (tetra ethyl ortho silicate) layer 114. If the trench has a depth of, for example, about 0.25 μm, the USG layer 113 preferably has a thickness of about 5000 Å.

Figure 2E:
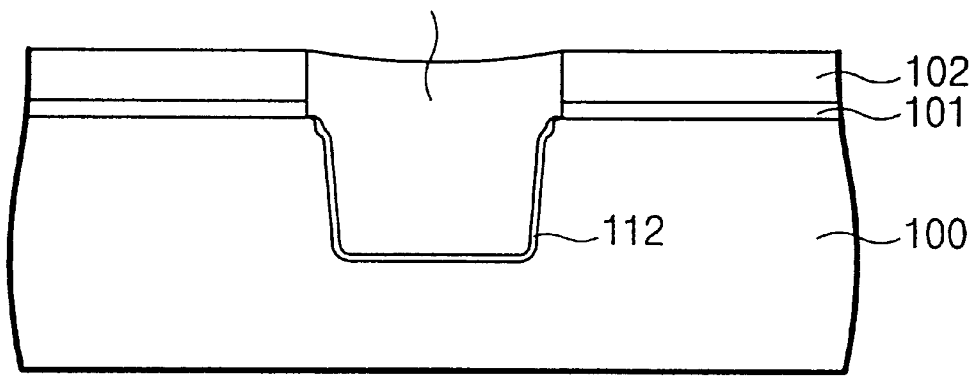

Referring to FIG. 2*e*, a planarization process is conducted on the trench fill insulating layers 113 and 114 thereby to form an isolation trench 113*a*. Herein, the pad nitride layer 102 serves as a planarization stop layer and the planarization process may be CMP(chemical mechanical polishing).

After planarization process, annealing is performed. The annealing will be described with reference to FIG. 3.

Figure 3:
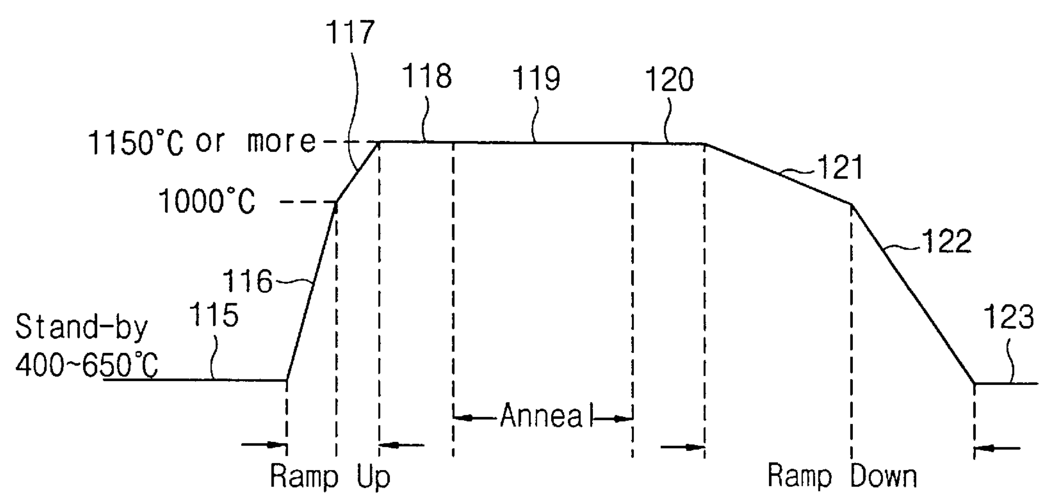
FIG. 3 is a schematic view showing an annealing process for densification of the trench fill layer according to the present invention.

FIG. 3 is a schematic view showing an annealing process for densification of the trench fill layers 113 and 114 according to the present invention. Now, referring to FIG. 3, after planarizing the trench fill layers 113 and 114, the annealing is performed so as to remove substrate defects resulting from the etching of the semiconductor substrate 100 and to densify the trench fill layers 113 and 114. To explain more in detail, a first stand-by stage 115 has a temperature between 400° C. and 650° C. is followed by a first ramp up stage 116 which increases the temperature at a rate of 7.5° C./min from the temperature of the stand-by stage 115 up to 1000° C. The first ramp up stage 116 has the same temperature increasing rate as the conventional annealing recipe for below 1000° C. illustrated in reference number 1 of FIG. 1.

The next process sequence is critical to this invention. A second ramp up stage 117 increases the temperature at the rate of 5.0° C./min from 1000° C. up to 1150° C. or more. The second ramp up stage 117 has lower temperature increasing rate than the first ramp up stage 116. This is to minimize the stress applied to the semiconductor substrate 100. An annealing stage 119 densifies the trench fill layers 113 and 114 at the temperature 1150° C. or more reached in the second ramp up stage. The annealing stage 119 is preferably performed in a nitrogen atmosphere. The reference numbers 118 and 120 represent respective stand-by stages before and after the annealing stage 119.

After the annealing stage 119, a first ramp down stage 121 decreases temperature at the rate of 2.0° C./min from 1150° C. or more down to 1000° C. A second ramp down stage 122 decreases the temperature at the rate of 3.3° C./min from 1000° C. down to the temperature of a stand-by stage 123, i.e., 400 to 650° C. The second ramp down stage 122 has the same temperature decreasing rate as the conventional art for below 1000° C. illustrated in reference number 6 of FIG. 1. The first ramp down stage 121 has lower temperature decreasing rate than that of the second ramp down stage 122. This is also to minimize the stress applied to the semiconductor substrate 100. The reference number 123 represents the unloading stage of the semiconductor substrate 100 after annealing for densification the trench fill layers 113 and 114.

Alternatively, the annealing for densification of the trench fill layers 113 and 114 can be performed after annealing process for removal of the substrate defects resulting from the etching of the semiconductor substrate 100 which is followed by planarization process. Such annealing before planarization is preferably performed in a nitrogen atmosphere at a temperature of 1000° C. or less.

Figure 2F:
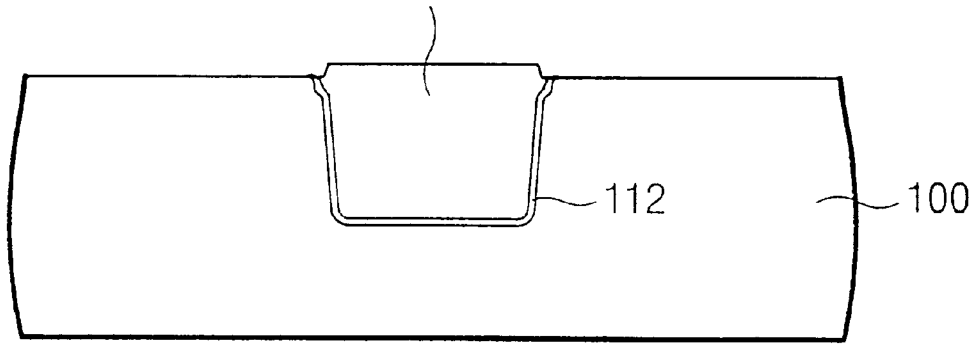

Now, referring to FIG. 2*f*, the pad nitride layer 102 and the pad oxide layer 101 are removed thereby to form the isolation trench 113*a* having good characteristics.

Figure 4:
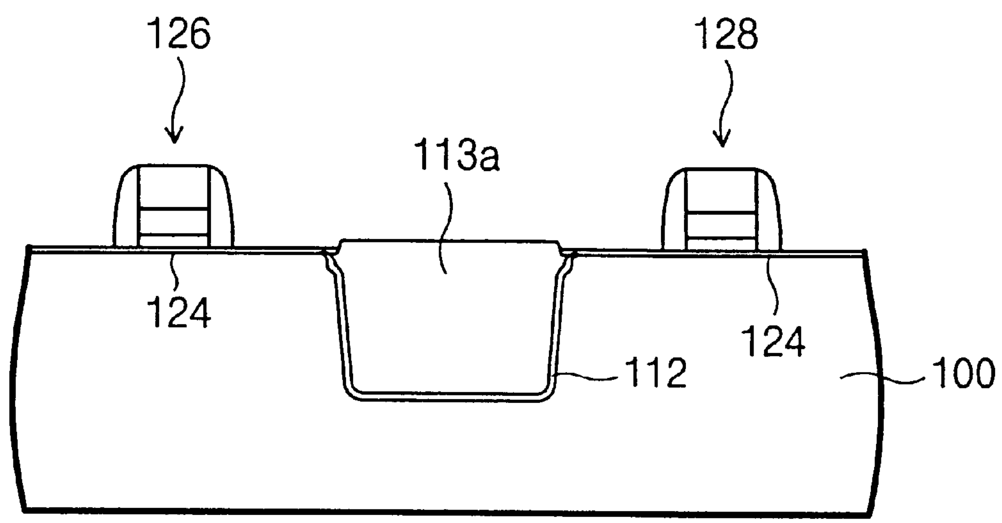
FIG. 4 is a cross-sectional view showing an isolation trench according to an embodiment of the present invention.

FIG. 4 is a cross-sectional view showing a trench isolation according to embodiment of the present invention. After forming the isolation trench 113*a*, a gate oxide layer 124 and gate electrode layers 126 and 128 are laminated in this order over the device forming region(b) in the semiconductor substrate 100 and the laminated layer is patterned to form gate structure. Accordingly, the gate structure is isolated from each other by the isolation trench 113*a*, i.e., device isolation region.

As understood from the above explanation, in accordance with the present invention, the novel method for forming trench isolation provides optimized annealing temperature thereby removing substrate defects caused during the step of etching a semiconductor substrate and relieving stress thereby improving yield and reliability of the device.

While this invention has been particularly shown and described with reference to the preferred embodiments thereof, it will be understood by those skilled in the art that various changes in form and details may be made without departing from the spirit and scope of this invention.

What is claimed is:

1. A method of forming an isolation trench in a semiconductor device comprising:

forming a trench etch mask layer over a semiconductor substrate;

patterning the trench etch mask layer and exposing the semiconductor substate where an isolation trench is to be formed;

etching an exposed portion of the semiconductor substrate, thereby forming the isolation trench;

forming a thin oxide layer in the isolation trench;

filling up the isolation trench with an insulating layer;

performing first annealing at a temperature below a first temperature so as to remove substrate defects caused during said etching of the semiconductor substrate and to densify the insulating layer;

planarizing the insulating layer, and performing second annealing at a temperature above the first temperature so as to remove substrate defects caused during said etching of the semiconductor and to densify said insulating layer.

2. The method according to claim 1, wherein the first temperature is 1000° C.

3. The method according to claim 1, further comprising, prior to said patterning, laminating the trench etch mask layer with a pad oxide layer, a pad nitride layer, a high temperature oxide layer, and an anti-reflective coating layer in this order.

4. The method according to claim 1, wherein said etching forms an isolation trench having a depth between 0.1 μm and 1.5 μm.

5. The method according to claim 1, wherein said forming forms a thin oxide layer having a thickness between about 100 Å and 500 Å.

6. The method according to claim 1, wherein said filling includes using an undoped silicate glass layer as the insulating layer.

7. The method according to claim 1, wherein said second annealing comprises:

first increasing a temperature at a first increasing rate from a stand-by temperature in a stand-by state to the first temperature;

second increasing the temperature at a second increasing rate from the first temperature to a second temperature;

densifying the insulating layer at the second temperature;

first decreasing the temperature at a first decreasing rate from the second temperature down to the first temperature; and second decreasing the temperature at a second decreasing rate from the first temperature down to the stand-by temperature.

8. The method according to claim 7, wherein at least one of the second increasing rate is less than the first increasing rate and the first decreasing rate is less than the second decreasing rate.

9. The method according to claim 8, wherein the second increasing rate is less than the first increasing rate and the first decreasing rate is less than the second decreasing rate.

10. The method according to claim 7, wherein the first increasing rate is 7.5° C./min, the first temperature is 1000° C., the second increasing rate is 5.0° C./min, and the second temperature is at least 1150° C.

11. The method according to claim 7, wherein the first temperature is 1000° C., the second temperature is at least 1150° C., the first decreasing rate is 2.0° C./min, and the second decreasing rate is 3.3° C./min.

* * * * *